US011152414B2

(12) United States Patent
Lin et al.

(10) Patent No.: US 11,152,414 B2
(45) Date of Patent: *Oct. 19, 2021

(54) IMAGE SENSOR INCLUDING DUAL ISOLATION AND METHOD OF MAKING THE SAME

(71) Applicant: TAIWAN SEMICONDUCTOR MANUFACTURING COMPANY, LTD., Hsinchu (TW)

(72) Inventors: Jeng-Shyan Lin, Tainan (TW);
Dun-Nian Yaung, Taipei (TW);
Jen-Cheng Liu, Hsinchu (TW);
Chun-Chieh Chuang, Tainan (TW);
Volume Chien, Sinying (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 51 days.

This patent is subject to a terminal disclaimer.

(21) Appl. No.: 16/259,859

(22) Filed: Jan. 28, 2019

(65) Prior Publication Data

US 2019/0172857 A1    Jun. 6, 2019

Related U.S. Application Data

(62) Division of application No. 14/886,290, filed on Oct. 19, 2015, now Pat. No. 10,192,918, which is a division of application No. 12/751,126, filed on Mar. 31, 2010, now Pat. No. 9,196,547.

(60) Provisional application No. 61/166,657, filed on Apr. 3, 2009.

(51) Int. Cl.
*H01L 27/146* (2006.01)
*H01L 21/762* (2006.01)
*H01L 21/8238* (2006.01)

(52) U.S. Cl.
CPC .... *H01L 27/1463* (2013.01); *H01L 21/76229* (2013.01); *H01L 21/823878* (2013.01); *H01L 27/1464* (2013.01); *H01L 27/14643* (2013.01); *H01L 27/14683* (2013.01); *H01L 27/14689* (2013.01); *H01L 27/14621* (2013.01)

(58) Field of Classification Search
CPC combination set(s) only.
See application file for complete search history.

(56) References Cited

U.S. PATENT DOCUMENTS 9,196,547 B2 * 11/2015 Lin .................. H01L 27/14683
2002/0024067 A1    2/2002 Han
2003/0045071 A1    3/2003 Hong et al.
(Continued)

FOREIGN PATENT DOCUMENTS

KR    10-2002-65083    10/2002

*Primary Examiner* — Suberr L Chi
(74) *Attorney, Agent, or Firm* — Hauptman Ham, LLP

(57) ABSTRACT

An image sensor includes a substrate having a pixel region and a periphery region. The image sensor further includes a first isolation structure formed in the pixel region; the first isolation structure including a first trench having a first depth. The image sensor further includes a second isolation structure formed in the periphery region; the second isolation structure including a second trench having a second depth greater than the first depth. The pixel region includes only NMOS devices and the periphery region includes both NMOS and PMOS devices.

20 Claims, 14 Drawing Sheets

(56) References Cited

U.S. PATENT DOCUMENTS

| | | |
|---|---|---|
| 2005/0079722 A1 | 4/2005 | Yu |
| 2005/0142808 A1 | 6/2005 | Otsuki |
| 2005/0233493 A1 | 10/2005 | Augusto |
| 2007/0004167 A1 | 1/2007 | Lee |
| 2008/0057612 A1 | 3/2008 | Doan et al. |
| 2008/0303932 A1* | 12/2008 | Wang ................ H01L 27/14689 348/308 |
| 2009/0111254 A1 | 4/2009 | Yang et al. |
| 2009/0162989 A1 | 6/2009 | Cho et al. |
| 2009/0242950 A1 | 10/2009 | McCarten et al. |

* cited by examiner

IMAGE SENSOR INCLUDING DUAL ISOLATION AND METHOD OF MAKING THE SAME

PRIORITY CLAIM

The present application is a divisional of Ser. No. 14/886,290, filed Oct. 19, 2015, which is a divisional of U.S. application Ser. No. 12/751,126, filed Mar. 31, 2010, now U.S. Pat. No. 9,196,547, issued Nov. 24, 2015, which claims priority of U.S. Provisional Application No. 61/166,657, filed Apr. 3, 2009, which are incorporated herein by reference in their entireties.

FIELD OF THE INVENTION

The present invention is generally related to semiconductor devices, and particularly to dual shallow trench isolation. In various embodiments, the dual shallow trench isolation is used in high performance Complementary Metal-Oxide-Semiconductor image sensors.

BACKGROUND

CIS (CMOS Image Sensors) are used in numerous applications including digital still cameras. In semiconductor technologies, image sensors are used for sensing exposed lights projected towards a semiconductor substrate. Generally, these devices utilize an array of active pixels (i.e., image sensor elements or cells) comprising photodiode and other elements (e.g., transistors) to convert images into digital data or electrical signals. CIS products generally include a pixel (or pixel array) region and a periphery region.

STI (shallow trench isolation) is an integrated circuit feature that prevents current leakage between adjacent semiconductor components. Various approaches use a single STI structure for both the pixel array and periphery regions in CIS. That is, the depth of the STI in the pixel array region and that of the periphery region is at the same level.

Dark current is unwanted current generated by pixels in the absence of illumination. Signals related to dark current may be referred to as dark signals. Sources of dark current include impurities in the silicon wafer that can cause damages to the silicon crystal lattice by processing techniques and heat buildup in the pixel region. Excessive dark current may cause leakage and lead to image degradation and poor device performance. As pixels scale down (e.g., in advanced CIS), dark current leakage tolerance also needs to be scaled down.

BRIEF DESCRIPTION OF THE DRAWINGS

The details of one or more embodiments of the invention are set forth in the accompanying drawings and the description below. Other features and advantages of the invention will be apparent from the description, drawings, and claims.

Like reference symbols in the various drawings indicate like elements.

DETAILED DESCRIPTION

Figure 1:
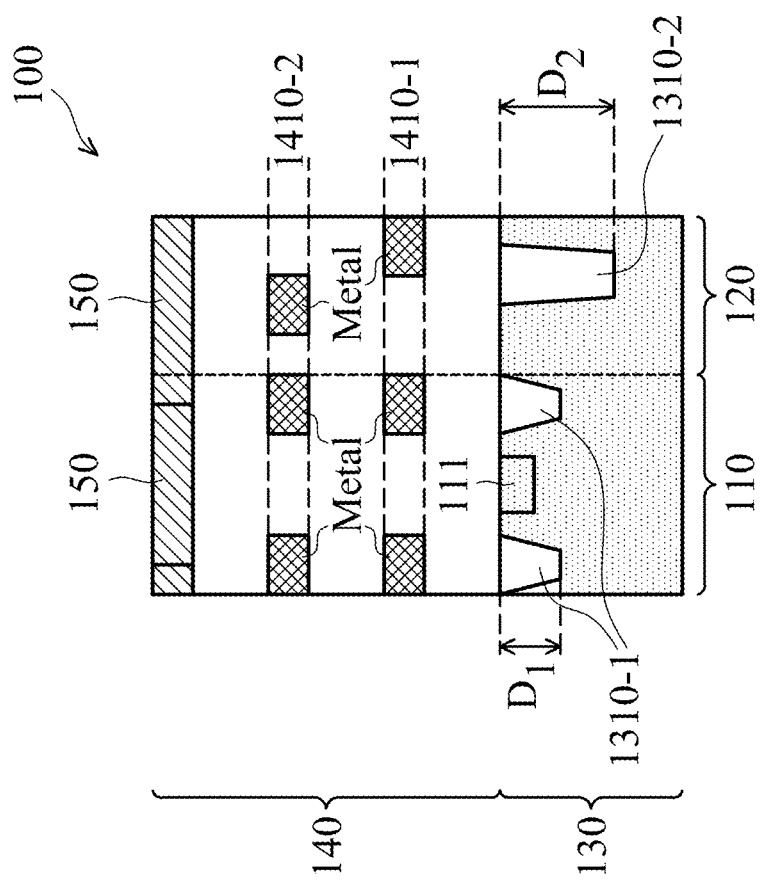
FIG. 1 shows a cross section of an example image sensor that can utilize embodiments of the invention.

Embodiments, or examples, of the invention illustrated in the drawings are now being described using specific languages. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

FIG. 1 shows a cross section of an image sensor 100, in accordance with an embodiment. Image sensor 100 includes a pixel array region 110, a periphery region 120, a substrate (e.g., silicon) 130, a backend process region 140, and filters 150. The below description is by way of the illustrative image sensor 100, but embodiments of the invention are applicable to other devices, such as active pixel sensors, charge coupled device (CCD) sensors or the like, embedded devices (e.g., DRAM (dynamic random access memory)) and those that can be subject to leakage if only one STI structure is used.

Image sensor 100 may be a front-side illumination (FSI) or a backside illumination sensor (BSI). Those skilled in the art will recognize that in FSI technology light is emitted from the front surface of the wafer while in BSI technology light is emitted in the backside of the wafer. Embodiments of the invention are applicable in both FSI and BSI processes.

Pixel array region 110, also known in the art as pixel region, generally includes pixels arranged in arrays (not shown) wherein each pixel may include various devices (e.g., transistors). Pixel array region 110 may also include various elements such as photo detectors (not shown), etc. For illustration purposes, only photodiode 111 is shown in FIG. 1. Photodiode 111 senses the amount of light radiation directed towards pixels, records intensity or brightness of light, etc. Pixel array region 110 may be configured to absorb light radiation and generate optical charges or photo-electrons that are collected and accumulated in a light sensing region of the photo detector (e.g., photo detector 111). Generally, transistors (not shown) in pixel array region 110 include various types of transistors such as reset transistors, source-follower transistors, transfer transistors, etc., and may be configured to readout the generated photo-electrons and convert them into electrical signals. Depending on different devices and applications, voltages used in pixel array region 110 may range from 2.8-3.0V.

Periphery region 120 may be referred to as a logic region because it may include logic circuitry associated with pixels in pixel array region 110. Periphery region 120 typically includes circuitry and inputs/outputs to provide an operation environment for the pixels and to provide support for external communications with the pixels. Example circuitry in periphery region 120 includes transistors, circuitry to drive the pixels to obtain signal charges, A/D converters, processing circuits for forming output signals, electrical connections, other components, etc. Depending on applications, periphery region 120 can have high voltage (e.g., up to 3.3V) usages.

Figure 8:
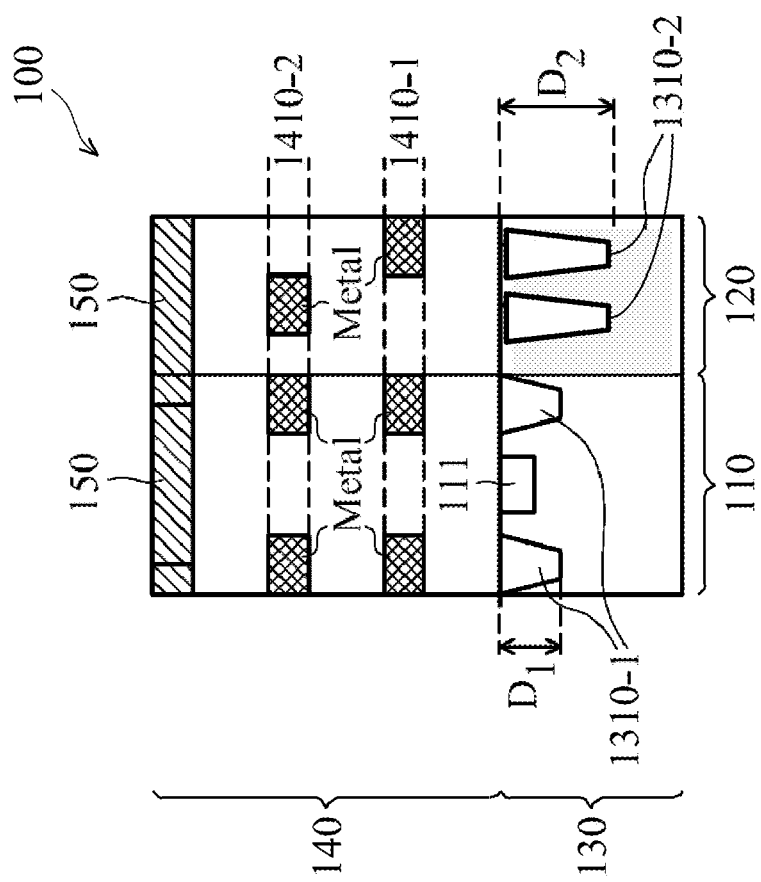
FIG. 8 shows a cross section of an example image sensor that can utilize embodiments of this invention.

Substrate 130 includes, for example, silicon, silicon carbide, germanium, etc. Substrate 130 may be formed by being doped with semiconductor dopant (e.g., P-type, N-type, etc.). Substrate 130 includes shallow trench features such as shallow trench isolations (STIs) 1310. For illustration purposes, STIs 1310 in pixel array region 110 are referred to as STIs 1310-1 while STIs 1310 in periphery region 120 are referred to as STIs 1310-2. For illustration purposes, only two STIs 1310-1 and one STI 1310-2 are shown, but embodiments of the invention are applicable in situations with various numbers of STIs 1310-1 and 1310-2 (as seen in FIG. 8). STIs 1310 may define and isolate active regions for various electronic devices of image sensor 100.

Embodiments of the invention provide isolation features through STI 1310 based on the need of each pixel area region 110 and periphery region 120. As a result, embodiments include different structures of STIs 1310 (e.g., STIs 1310-1 and 1310-2) wherein an STI structure includes a trench having a depth and the depths (e.g., depths D1 and D2) of STIs 1310-1 and STIs 1310-2 are of different dimensions. For example, in various embodiments, pixel array region 110 includes NMOS devices while periphery region 120 includes both NMOS and PMOS devices having corresponding P- and N-wells. Depending on implementations, the P- and N-wells may be referred to as twin wells. Because of only NMOS devices in pixel array region 110, depth D1 is shallow and provides sufficient isolation for the NMOS devices (e.g., with corresponding poly end caps and others). In contrast, because of both types of NMOS and PMOS devices and corresponding wells (e.g., twin wells) are present in periphery region 120, embodiments of the invention provide additional and more protective isolation in the periphery region 120. That is, depth D2 is deeper than depth D1, resulting in STIs 1310-2 being deeper/larger than STIs 1310-1. If depth D1 is deeper than necessary (e.g., the same depth as D2), STI 1310-1 would be larger and have a larger interface (e.g., larger side walls and bottoms) with substrate 130 and therefore would allow additional opportunity for interface leakage current and leakage around corners of STIs 1310-1. In contrast, without effective isolation (e.g., deeper/larger STIs) in periphery region 120 (e.g., depth D2 is shorter or is the same as depth D1), dark current would leak between the wells (e.g., leak between PMOS device and NMOS substrate). In effect, embodiments of the invention improve performance (e.g., dark signals/dark current performance) as compared to other approaches where only one structure of STI with a single depth is used. The single STI structure does not provide the appropriate isolation needed for each of the pixel array region 110 and periphery region 120. Depending on applications, depth D1 may be in the range of 100-4000 Å while depth D2 may be in the range of 2500-4500 Å, even though other ranges are all within the scope of the invention. In an embodiment, depth D1 is about 1000 Å while depth D2 is about 4000 Å.

Backend process region 140 refers to a region or structure where backend processes may be performed on a semiconductor wafer. Those skilled in the art will recognize that a semiconductor fabrication process generally includes a front-end process (front end of line—FEOL) for semiconductor devices (e.g., transistors, resistors, capacitors, etc.) to be fabricated up to but not including metal one layer. In contrast, a backend process (or back end of line—BEOL) interconnects devices within the metal layers, forms electrical connections to external devices, etc. Backend process regions or structures (e.g., region 140) generally include vias, inter-level dielectrics, metal layers, passivation layers, bonding pads, packaging, etc. In an embodiment, front-end process refers to semiconductor fabrication process up to the contact process while the backend process refers to processes after that. For illustration purposes, backend process region 140 in FIG. 1 shows only metal layers 1410 (e.g., layers 1410-1, 1410-2, etc.), but embodiments of the invention are applicable to other elements in backend process region 140. Metal layers (e.g., layers 1410) are used to provide connections between the various electronic devices of image sensor 100.

Color filters 150 are to filter colors and include, for example, blue-, green-, red-color filters, etc.

Figure 2:
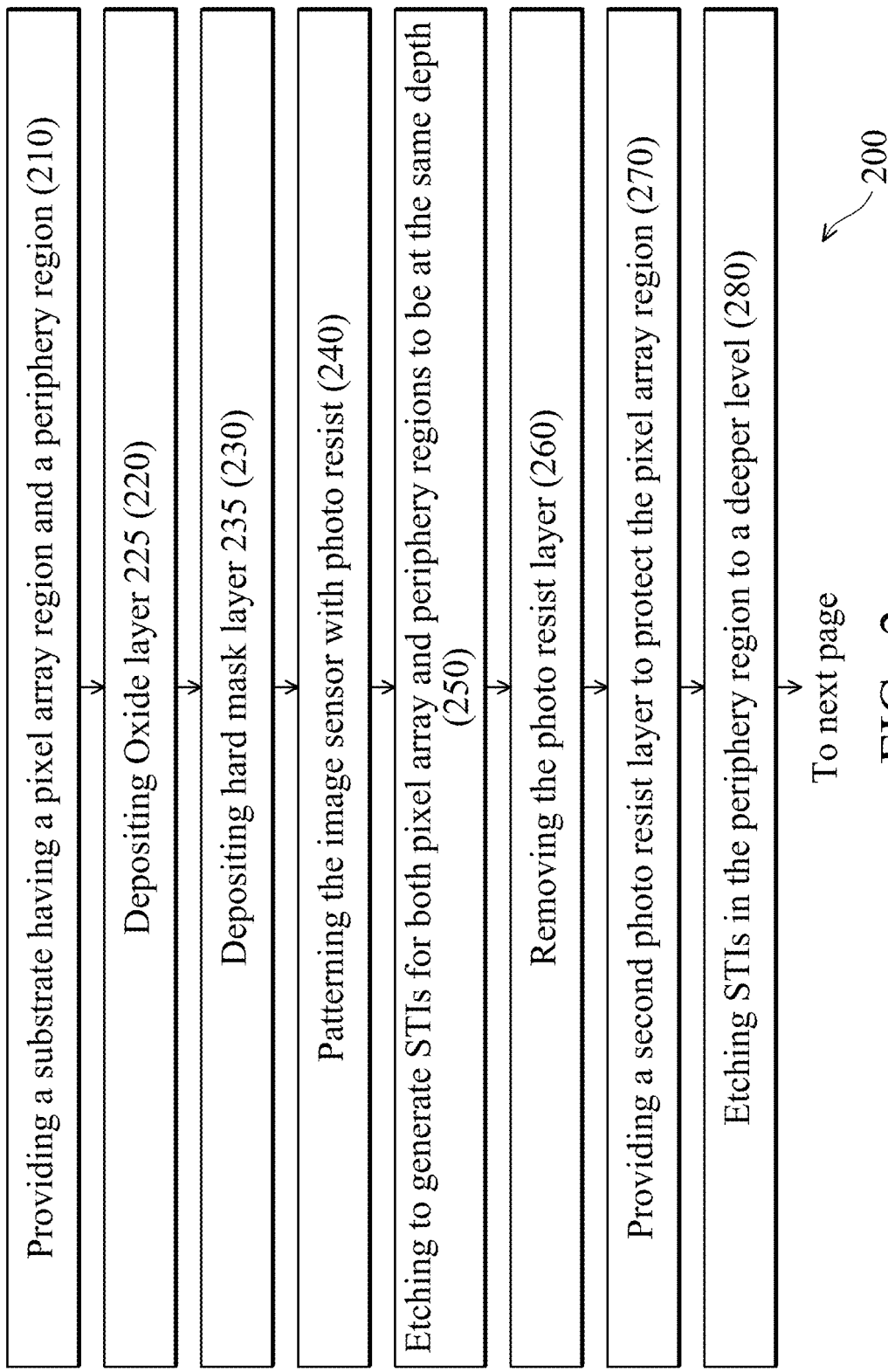
FIG. 2 shows a flowchart illustrating a first embodiment for a method of fabricating an image sensor.
Figure 2:
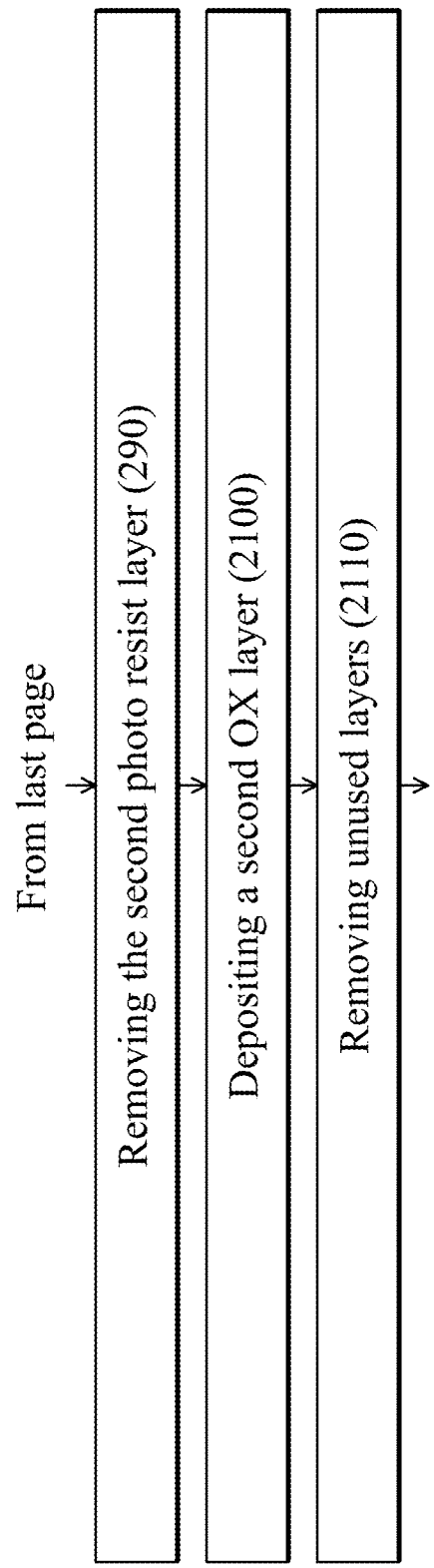
Figure 3:
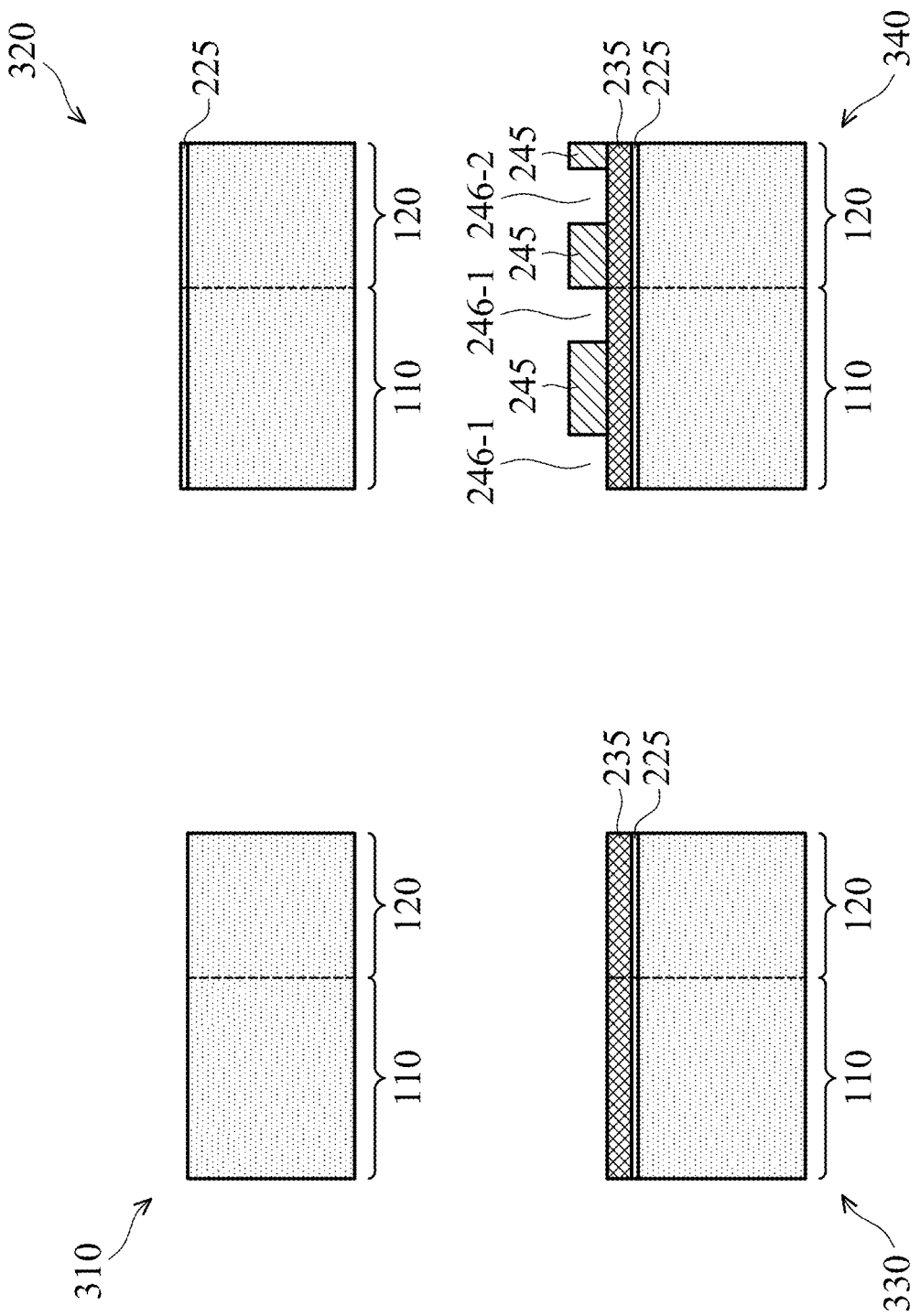
FIG. 3 shows images of the image sensor corresponding to the blocks in FIG. 2.
Figure 3:
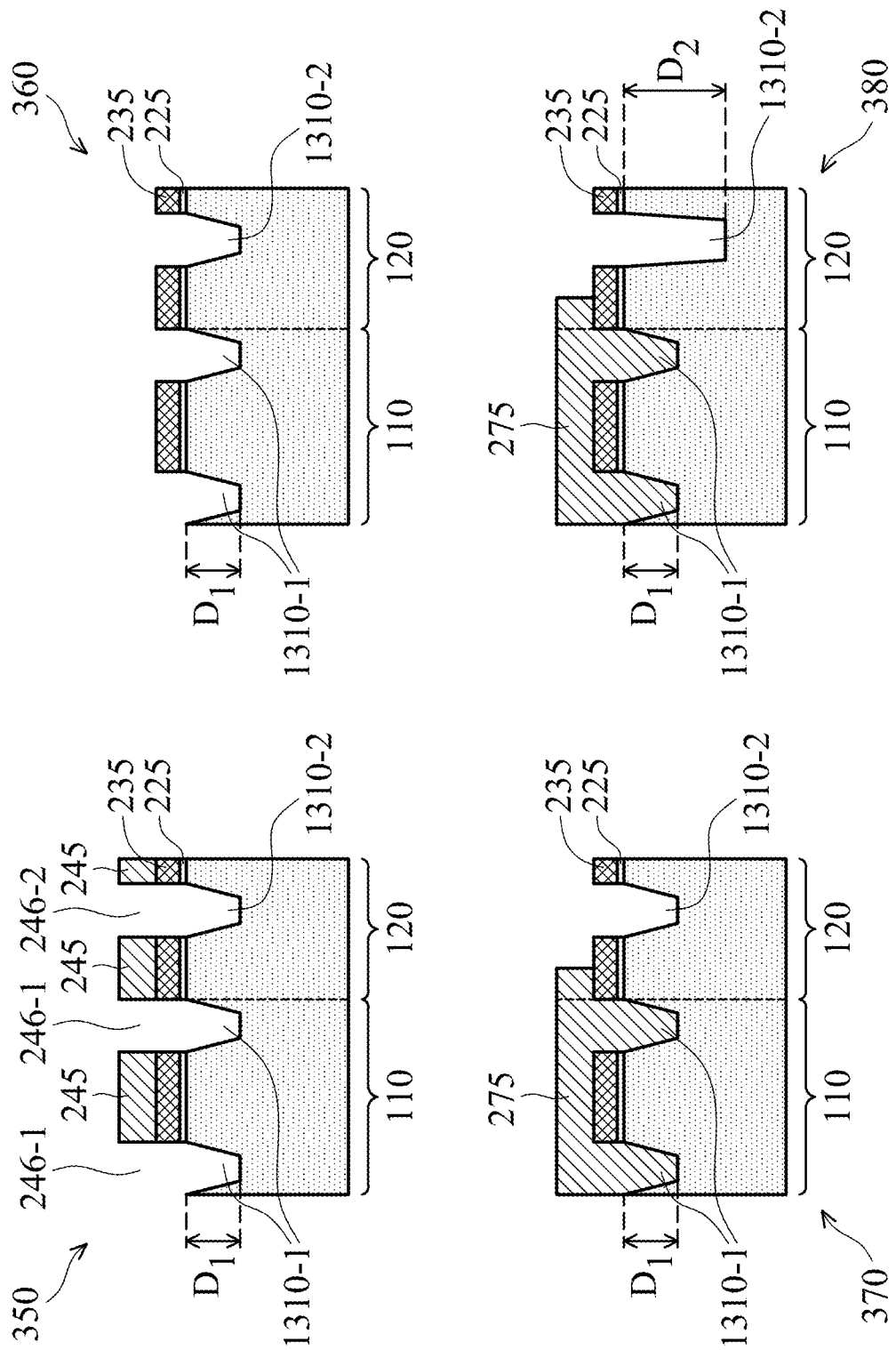
Figure 3:
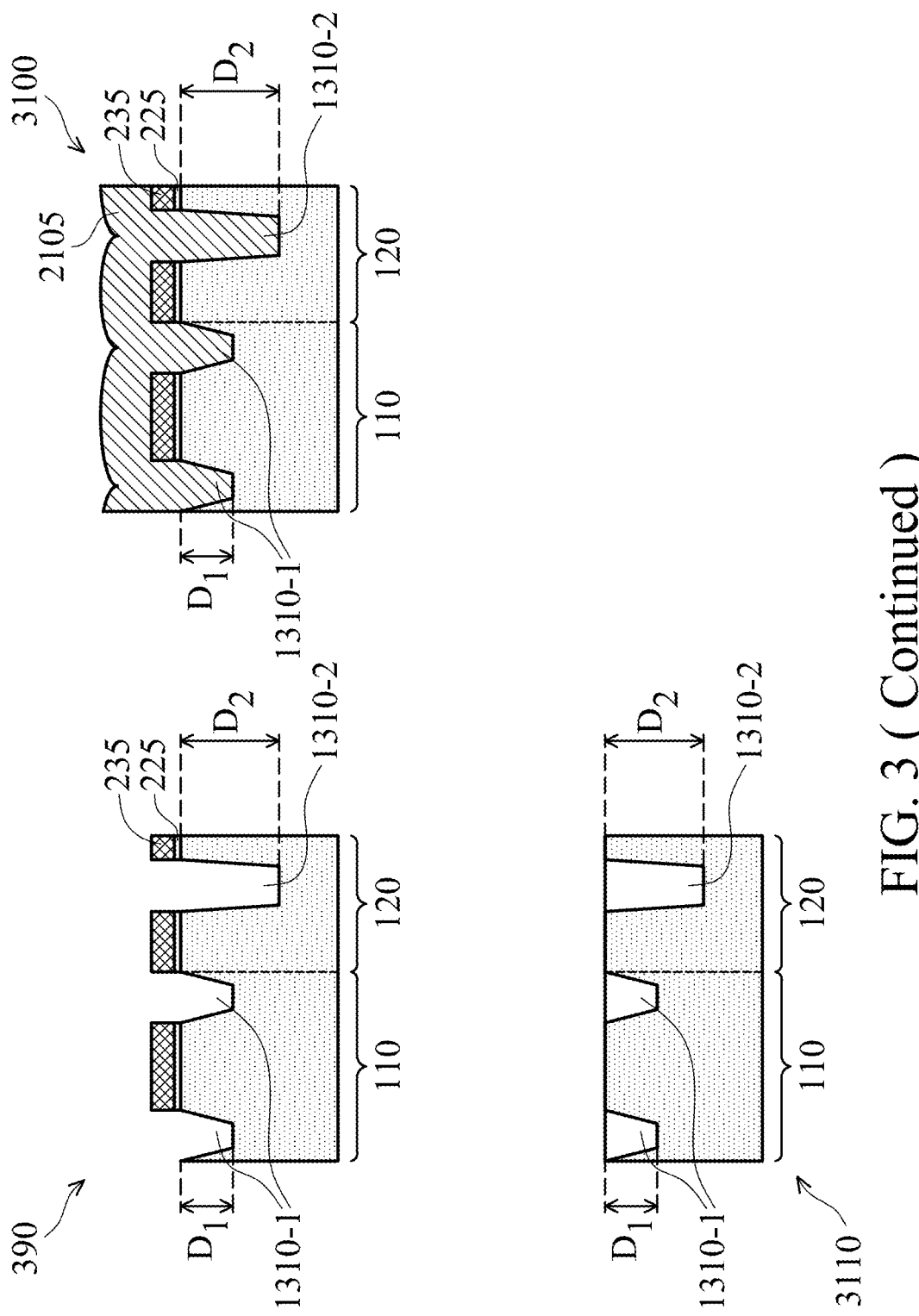

FIG. 2 shows a flowchart 200 illustrating a first method embodiment for fabricating an image sensor (e.g., image sensor 100). For illustration purposes, only steps related a front-end process are provided. Once the front-end process is complete, backend process may be performed in accordance with various mechanisms. FIG. 3 shows images 310-3100 corresponding to blocks 210-2100 in FIG. 2, respectively.

In block 210, substrate 130 of image sensor 100 having pixel array region 110 and peripheral region 120 is provided, shown as image 310 in FIG. 3.

In block 220, oxide (OX) layer 225 is deposited on top of substrate 130 in both pixel array region 110 and periphery region 120, shown as image 320 in FIG. 3.

In block 230, hard mask layer 235 is deposited on top of layer 225 in both pixel array region 110 and periphery region 120, shown as image 330 in FIG. 3. Depending on applications, a hard mask can be SiN film, SiON or the like.

In block 240, image sensor 100 having layers OX 225 and hard mask layer 235 is photo patterned with a photo resist layer 245 for STIs in both pixel array region 110 and periphery region 120 (e.g., STIs 1310-1 and 1310-2), shown as image 340. Photo resist layer 245 includes openings 246-1 and 246-2 that correspond to STIs 1310-1 and 1310-2, respectively. This block 240 includes photo resist coating with layer 245, masking over the image sensor 100, exposing and forming openings 246-1 and 246-2.

In block 250, STIs 1310 for both pixel array region 110 and periphery array region 120 (e.g., STIs 1310-1 and STIs 1310-2) are created by etching hard mask layer 235, OX layer 225, and substrate 130 through openings 246-1 and 246-2, respectively. At this stage, STIs 1310-1 and 1310-20 are at the same level, i.e., depth D1 and D2 are equal or substantially equal. Alternatively expressed, STIs 1310-2 are at the depth D1. Block 250 corresponds to image 350 in FIG. 3.

In block 260, photo resist layer 245 is removed from image sensor 100, shown as image 360 in FIG. 3.

In block 270, a second photo resist layer (e.g., layer 275) is provided to protect the pixel array area 110 including STIs 1310-1. Block 270 corresponds to image 370 in FIG. 3.

In block 280, STIs 1310-2 of periphery region 120 are further etched for a deeper depth, e.g., from depth D1 to depth D2, shown as image 380 in FIG. 3.

In block 290, photo resister layer 275 is removed from image sensor 100, shown as image 390.

In block 2100, image sensor 100 having both STIs 1310-1 and 1310-2 is deposited with a second OX layer, e.g., layer 2105. In an embodiment, depositing layer 2105 is done by using an HDP (high density plasma) technique, but other techniques such as TEOS Oxide (Tetraethyl Orthosilicate, Si(OC$_2$H$_5$)) may be used, which include a relatively inert material but provides good conformality of coating, e.g., the deposited film having the same thickness regardless of the geometry of the underlying features.

In block 2110, unused layers (e.g., layers 235 and 225) are removed and STIs 1310 are polished using CMP (Chemical Mechanical Polishing), resulting in image 3110.

Figure 4:
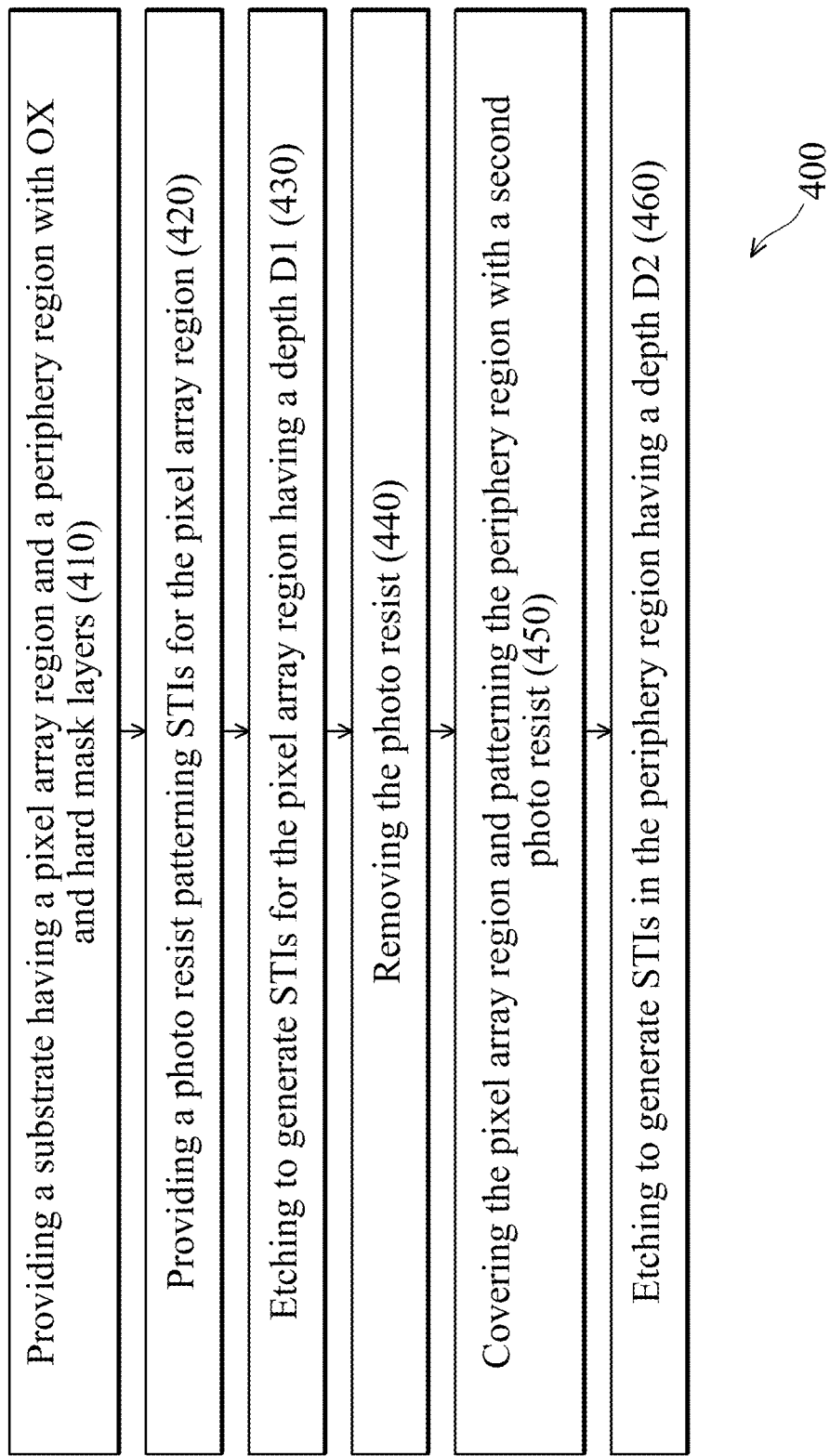
FIG. 4 shows a flowchart illustrating a second embodiment for a method of fabricating an image sensor.
Figure 5:
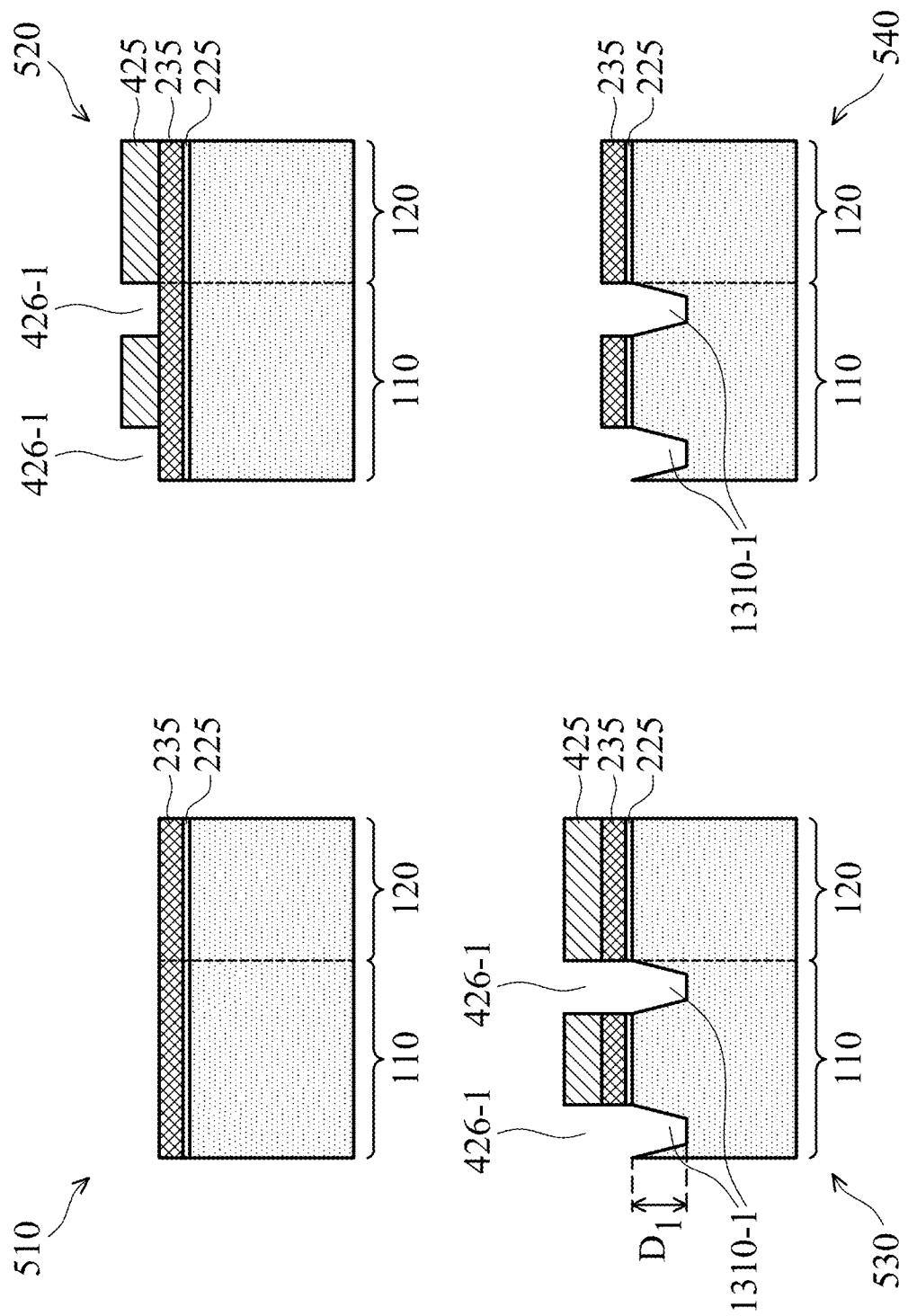
FIG. 5 shows images of the image sensor corresponding to the blocks in FIG. 4.
Figure 5:
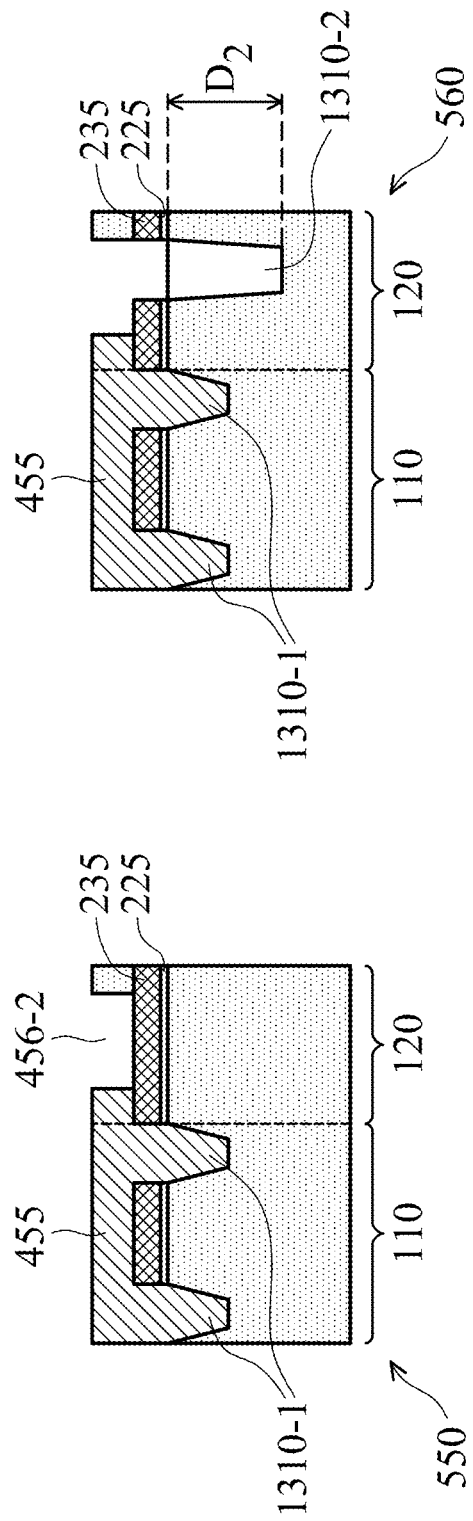

FIG. 4 shows a flowchart 400 illustrating a second method embodiment in fabricating an image sensor (e.g., sensor 100). FIG. 5 shows images 510-560 corresponding to block 410-460, respectively.

In block 410, substrate 130 of image sensor 100 having OX layer 225 and hard mask layer 235 is provided. This substrate 130 represented by image 510 in FIG. 5 was created as described above with reference to image 330.

In block 420, a photo resist layer 425 is deposited on top of layer 235 patterning for STIs in the pixel array region 110 (e.g., STIs 1310-1). This patterning provides opening 426-1, as shown in image 520.

In block 430, STIs in the pixel array region 110 (e.g., STIs 1310-1) are created by etching via openings 426-1 through layers 225, 235, and substrate 130. STIs 1310-1 thus include a depth D1. Block 430 corresponds to image 530.

In block 440, layer 425 is removed, as shown in image 540.

In block 450, pixel array region 110 having STIs 1310-1 is covered with a photo resist layer (e.g., layer 455) having openings 456-2 patterning for STIs 1310-2 in periphery region 120, as shown in image 550.

In block 460, STIs 1310-2, via openings 456-2, are created having a depth D2 that is deeper than depth D1, as shown in image 560. After this stage sensor 100 may be processed using blocks 290 to 2110 as described above with reference to FIG. 2.

In the above embodiment, extra processes such as photo resist coating and dry etch back may be performed over the image sensor having STIs 1310-1 before the second photo resist (block 450) is performed to improve surface planarity and reduce stripe defects that could be caused by forming the first STI 11310-1 (block 430).

Figure 6:
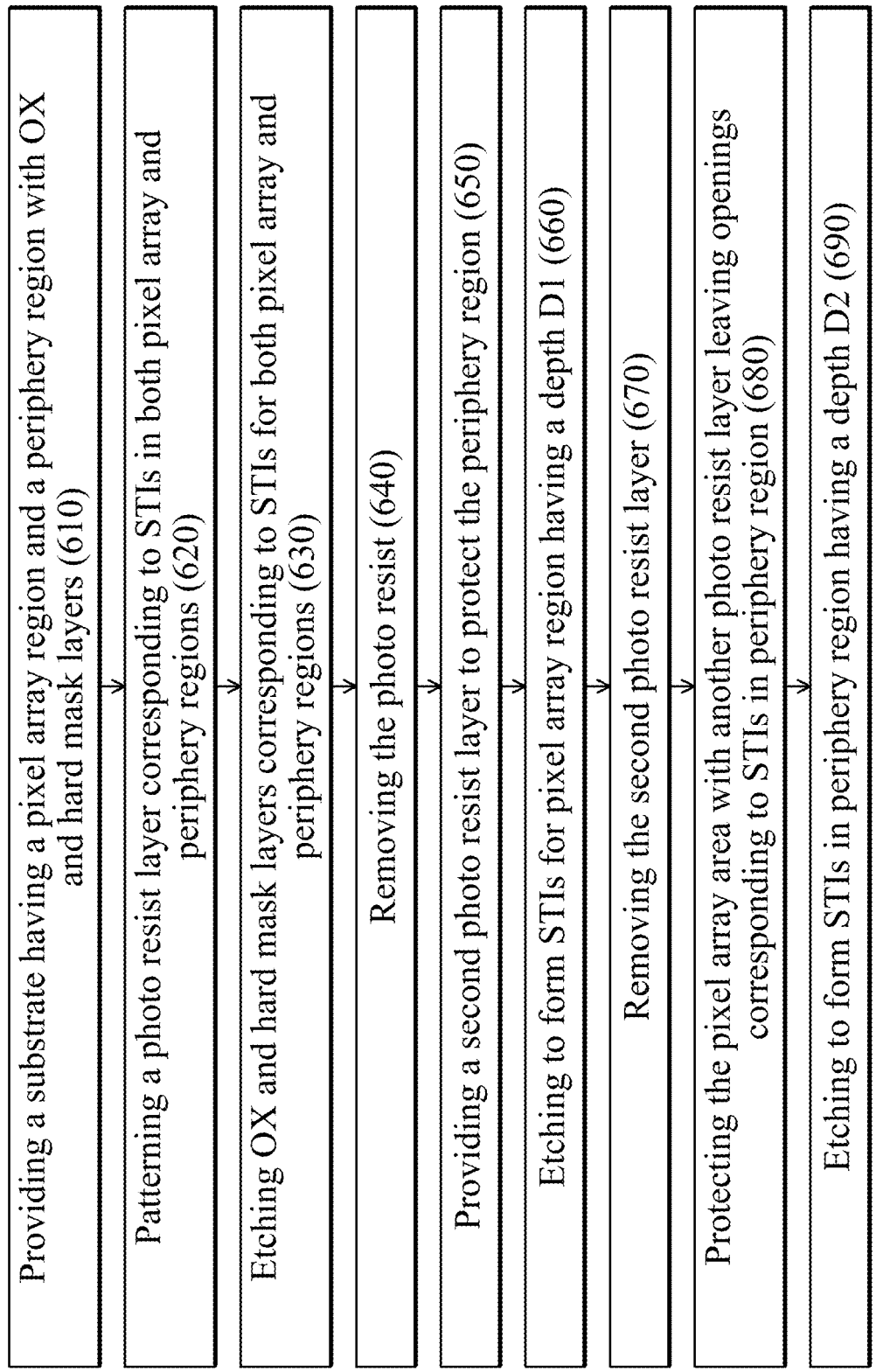
FIG. 6 shows a flowchart illustrating a third embodiment for a method of fabricating an image sensor.
Figure 7:
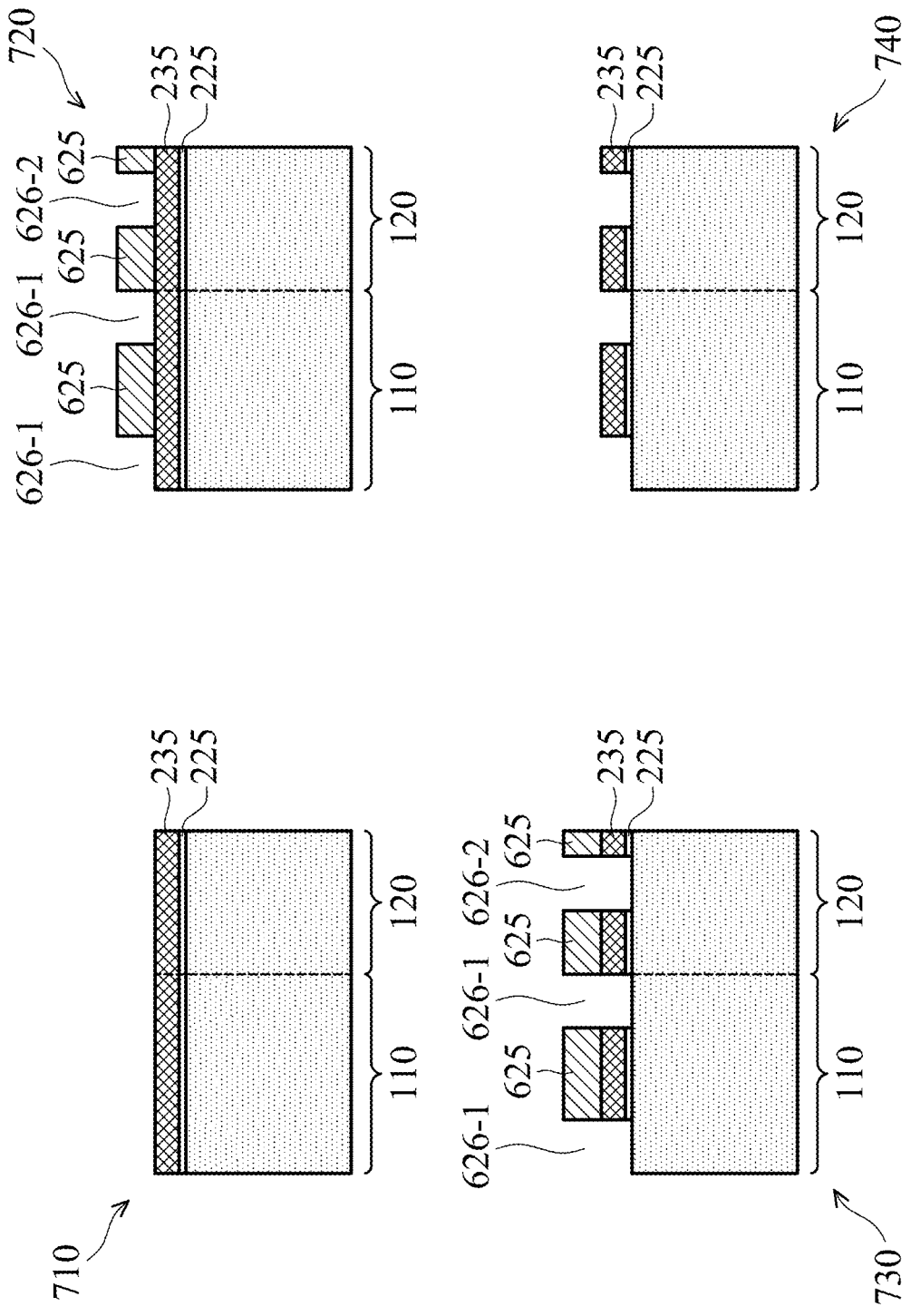
FIG. 7 shows images of the image sensor corresponding to the blocks in FIG. 6.
Figure 7:
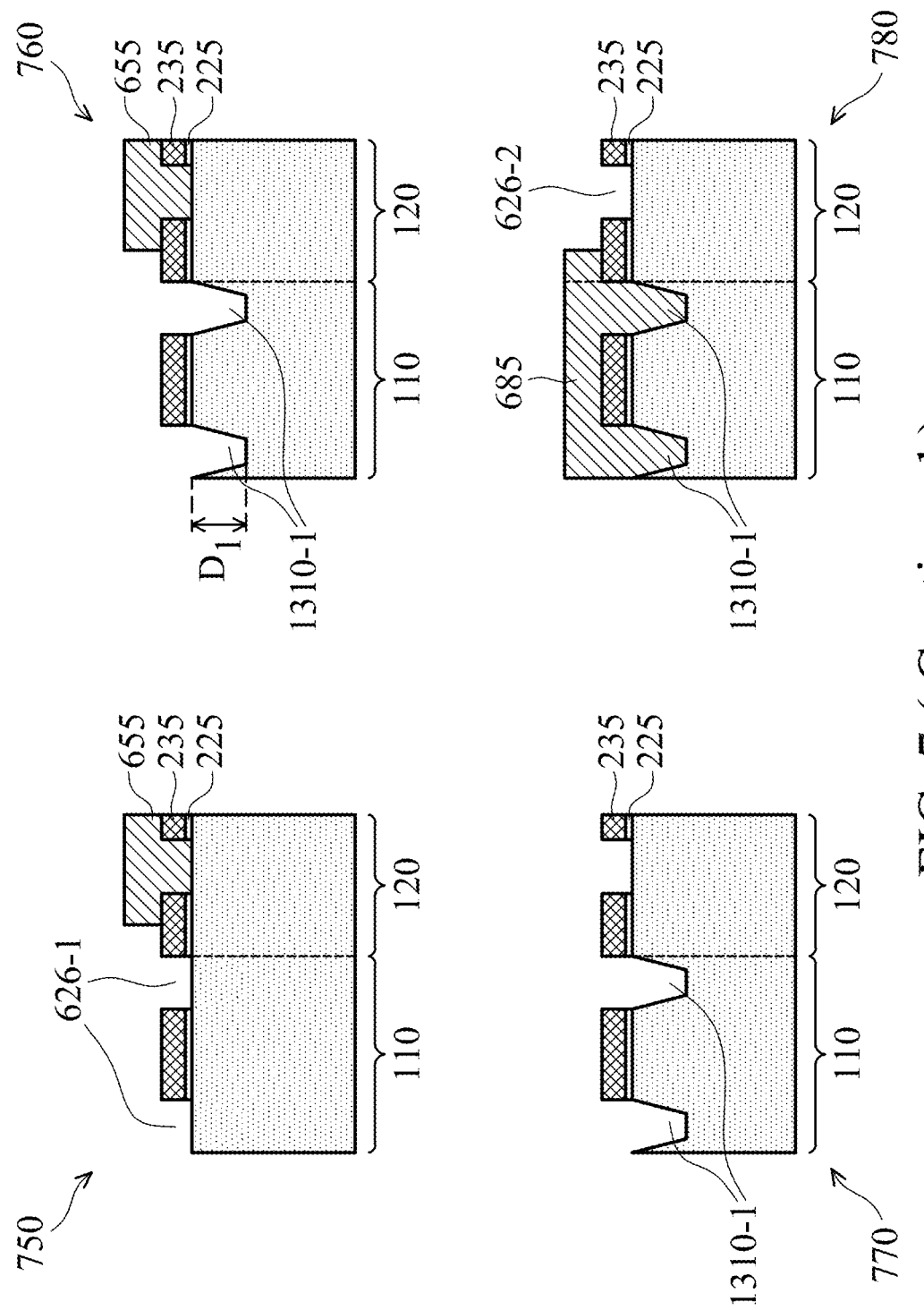
Figure 7:
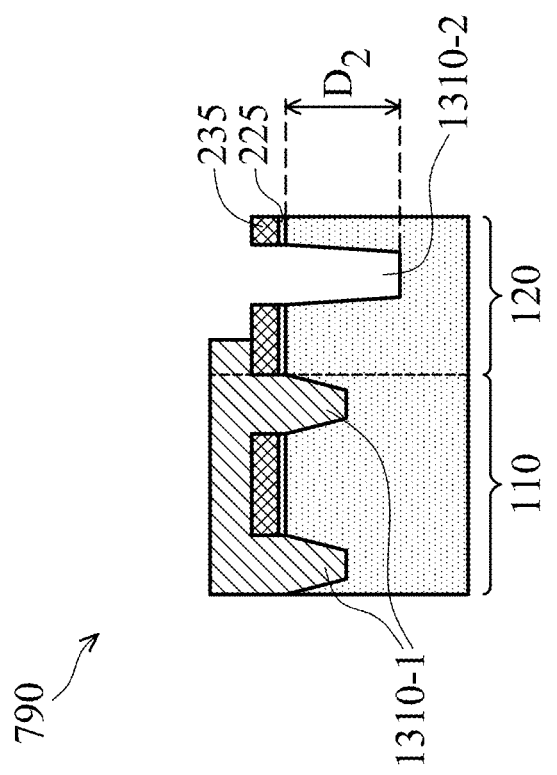

FIG. 6 shows a flowchart 600 illustrating a third method embodiment in fabricating an image sensor (e.g., sensor 110). FIG. 7 shows images 710-790 corresponding to blocks 610-690 respectively.

In block 610, substrate 130 of image sensor 100 having a pixel array region 110 and a periphery region 120 with layers OX 225 and hard mask 235 is provided. This substrate 130 represented by image 710 in FIG. 7 was created as described above with reference to image 330.

In block 620, a photo resist layer (e.g., layer 625) is deposited on top of layer 235. Layer 625 provides patterning for layers 235 and 225 corresponding to STIs for both pixel array region 110 and periphery region 120 (e.g., STIs 1310-1 and 1310-2). Layer 625 thus includes openings 626-1 and 626-2 for pixel array region 110 and periphery region 120 respectively.

In block 630, layers 235 and 225 corresponding to STIs 1310-1 and 1310-2 are etched through openings 626-1 and 626-2.

In block 640 photo resist layer 625 is removed resulting in image 740.

In block 650, another photo resist layer (e.g., layer 655) is deposited to cover the opening 626-2 corresponding to STIs 1310-2. This layer 655 protects periphery region 120.

In block 660, substrate 130 is etched to form STIs for pixel array region 110 (e.g., STIs 1310-1) having a depth D1, shown as image 760.

In block 670, layer 655 is removed resulting in image 770.

In block 680, pixel array region 110 is protected with another photo resist layer (e.g., layer 685), resulting in image 780.

In block 690, substrate 130 of periphery region 120 is etched to form STIs for periphery region 120 (e.g., STI 1310-2) having a depth D2, which is deeper than depth D1. Block 690 corresponds to image 790. After this stage, sensor 100 is processed in accordance with blocks 290-2110 in FIG. 2 as described above.

In the above method embodiments, various techniques (e.g., etching, patterning) are discussed for illustration purposes, equivalences and/or different techniques may be used to achieve the same results as described above are within scope of embodiments of the invention, and the invention is not limited to a particular technique. For example, patterning may be done by photolithography, etching may be done by plasma etching to form various trenches and filling the trench with a dielectric material such as silicon oxide by a chemical vapor deposition (CVD). To achieve a better planar surface, the CVD process may use a high density plasma CVD (HDPCVD). The patterned photo resist may be removed using wet stripping or plasma ashing, etc. Depending on applications, different types of hard masks may be used, including, for example deep ultraviolet (DUV), I-line, 193-namometer masks, etc., or the like. DUV and 193 masks can be used to serve higher resolution patterns. Selecting a method embodiment is a design choice, considering various factors such as cost and quality. For example, the second and third embodiments can provide quality STI etching profile, but are more expensive.

A number of embodiments of the invention have been described. It will nevertheless be understood that various variations and/or modifications may be made without departing from the spirit and scope of the invention. For example, the above method embodiments show exemplary steps, but they are not necessarily required to be performed in the order shown. Additionally, steps may be added, replaced, changed order, and/or eliminated as appropriate, in accordance with the spirit and scope of embodiment of the invention.

One aspect of this description relates to an image sensor. The image sensor includes a substrate having a pixel region and a periphery region. The image sensor further includes a first isolation structure formed in the pixel region; the first isolation structure including a first trench having a first depth. The image sensor further includes a second isolation structure formed in the periphery region; the second isolation structure including a second trench having a second depth greater than the first depth. The pixel region includes only NMOS devices and the periphery region includes both NMOS and PMOS devices. In some embodiments, the first depth ranges from about 100 Å to about 4000 Å, and the second depth ranges from about 2500 Å to about 4500 Å. In some embodiments, the first depth is about 1000 Å and the second depth is about 4000 Å. In some embodiments, the image sensor includes a front-side illumination sensor or a backside illumination sensor. In some embodiments, the substrate includes a semiconductor device selected from the group consisting of a CMOS image sensor, an active pixel sensor, a charge coupled device sensor, and an embedded DRAM. In some embodiments, the image sensor further includes a plurality of metal layers over the substrate. In some embodiments, the image sensor further includes a plurality of color filers over a topmost metal layer of the plurality of metal layers. In some embodiments, the first isolation structure and the second isolation structure comprise a dielectric oxide.

Another aspect of this description relates to a method of forming an image sensor. The method includes depositing a material stack over a substrate. The substrate has a pixel area and a periphery area, and the material stack includes an oxide layer and a hard mask layer over the oxide layer. The method further includes etching the hard mask layer and the oxide layer to form a first opening in the pixel area and a second opening in the periphery area. The method further includes protecting the periphery area using a first photo resist layer; the first photo resist layer filling the second opening. The method further includes etching the substrate through the first opening to form a first trench in the pixel area. The first trench has a first depth. The method further includes protecting the pixel area using a second photo resist layer; the second photo resist layer filling the first opening. The method further includes etching the substrate through the second opening to form a second trench in the periphery area. The second trench has a second depth deeper than the first depth. In some embodiments, the method further includes forming at least one photo detector comprising one or more first NMOS devices in the pixel area, wherein the pixel area is free of PMOS devices. In some embodiments, the method further includes forming second NMOS devices and PMOS devices in the periphery area. In some embodiments, the method further includes depositing a dielectric material to fill the first trench and the second trench. In some embodiments, depositing the dielectric material comprises depositing a dielectric oxide using a high density plasma (HDP) or tetraethyl orthosilicate TEOS technique. In some embodiments, the method further includes removing the deposited dielectric material, the hard mask layer and the oxide layer from a top surface of the substrate. In some embodiments, removing the deposited dielectric material, the hard mask layer and the oxide layer is performed using chemical mechanical polishing (CMP). In some embodiments, depositing the material stack comprises depositing SiN or SiON to form the hard mask layer. In some embodiments, the first trench is formed to have the first depth ranging from 100 Å to 4000 Å, and the second trench is formed to have the second depth ranging from about 2500 Å to about 4500 Å.

Still another aspect of this description relates to a method of forming an image sensor. The method includes depositing an oxide layer over a substrate. The substrate has a pixel area and a periphery area. The method further includes depositing a hard mask layer over the oxide layer. The method further includes etching the hard mask layer and the oxide layer to form a first opening in the pixel area and a second opening in the periphery area. The first opening exposes a first portion of the substrate, and the second opening exposes a second portion of the substrate. The method further includes protecting the periphery area using a first photo resist layer, the first photo resist layer filling the second opening while exposing the first portion of the substrate. The method further includes etching the first portion of the substrate to form a first trench in the pixel area. The first trench has a first depth. The method further includes protecting the pixel area using a second photo resist layer, the second photo resist layer filling the first opening while exposing the second portion of the substrate. The method further includes etching the second portion of the substrate to form a second trench in the periphery area. The second trench has a second depth deeper than the first depth. The method further includes filling the first trench and the second trench with a dielectric material. In some embodiments, the method further includes forming at least one photo detector comprising one or more first NMOS devices in the pixel area, wherein the pixel area is free of PMOS devices, and forming second NMOS devices and PMOS devices in the periphery area. In some embodiments, etching the first portion of the substrate and etching the second portion of the substrate are performed by plasma etching.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. An image sensor comprising:
   a substrate having a pixel region and a periphery region;
   a first isolation structure formed in the pixel region, the first isolation structure including a first trench having a first depth; and
   a second isolation structure formed in the periphery region, the second isolation structure including a second trench having a second depth greater than the first depth,
   wherein the pixel region includes only NMOS devices and the periphery region includes both NMOS and PMOS devices.

2. The image sensor of claim 1, wherein the first depth ranges from about 100 Å to about 4000 Å, and the second depth ranges from about 2500 Å to about 4500 Å.

3. The image sensor of claim 1, wherein the first depth is about 1200 Å and the second depth is about 3200 Å.

4. The image sensor of claim 1, wherein the image sensor comprises a front-side illumination sensor or a backside illumination sensor.

5. The image sensor of claim 1, wherein the substrate comprises a semiconductor device selected from the group consisting of a CMOS image sensor, an active pixel sensor, a charge coupled device sensor, and a DRAM.

6. The image sensor of claim 1, further comprising a plurality of metal layers over the substrate.

7. The image sensor of claim 6, further comprising a plurality of color filters.

8. The image sensor of claim 1, wherein the first isolation structure and the second isolation structure comprise a dielectric oxide.

9. An image sensor comprising:
   a substrate having a pixel region and a periphery region;
   a photodiode in the pixel region;
   a plurality of first isolation structures in the pixel region, wherein the photodiode is between adjacent first isolation structures of the plurality of first isolation structures, and at least one of the plurality of first isolation structures comprises a first trench having a first depth; and
   a plurality of second isolation structures in the periphery region, wherein at least one of the plurality of second isolation structures comprises a second trench having a second depth greater than the first depth,
   wherein the pixel region includes only MOS devices having a first dopant type and the periphery region includes MOS devices having the first dopant type and a second dopant type, and the second dopant type is opposite the first dopant type, and the first dopant type is n-type.

10. The image sensor of claim 9, wherein the first depth ranges from about 1100 angstroms to about 1300 angstroms.

11. The image sensor of claim 9, wherein the second depth ranges from about 3100 angstroms to about 3300 angstroms.

12. The image sensor of claim 9, wherein the substrate comprises silicon.

13. The image sensor of claim 9, further comprising color filters.

14. The image sensor of claim 13, wherein the color filters include a blue color filter, a green color filter and a red color filter.

15. The image sensor of claim 13, wherein the color filters are configured to filter incident light prior to the incident light contacting the photodiode.

16. The image sensor of claim 9, further comprising metal layers configured to electrically connect the photodiode to a readout device.

17. An image sensor comprising:
a silicon substrate having a pixel region and a periphery region;
a photodiode in the pixel region;
logic circuitry in the periphery region;
a first shallow trench isolation (STI) structure in the pixel region adjacent to the photodiode, wherein the first STI structure extends from a surface of the silicon substrate to a depth ranging from 1100 angstroms to 1300 angstroms; and
a second STI structure in the periphery region, wherein the second STI structure extends from the surface of the silicon substrate to a depth ranging from 3100 angstroms to 3300 angstroms;
wherein the pixel region includes only NMOS devices and the periphery region includes NMOS devices and PMOS devices.

18. The image sensor of claim 17, further comprising a transistor electrically connected to the photodiode.

19. The image sensor of claim 17, wherein the pixel region comprises a transistor selected from the group consisting of a reset transistor, a source-follower transistor and a transfer transistor.

20. The image sensor of claim 17, wherein the image sensor is a backside illumination sensor (BSI).

* * * * *